(12) United States Patent
Xie et al.

(10) Patent No.: US 9,329,227 B2
(45) Date of Patent: May 3, 2016

(54) METHOD AND APPARATUS FOR TESTING INTERCONNECTION RELIABILITY OF A BALL GRID ARRAY ON A TESTING PRINTED CIRCUIT BOARD

(71) Applicant: Nvidia Corporation, Santa Clara, CA (US)

(72) Inventors: Dongji Xie, Santa Clara, CA (US); Min Woo, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 731 days.

(21) Appl. No.: 13/659,425

(22) Filed: Oct. 24, 2012

(65) Prior Publication Data

US 2014/0111242 A1 Apr. 24, 2014

(51) Int. Cl.
*G01R 31/26* (2014.01)
*G01R 31/28* (2006.01)
*G01R 1/04* (2006.01)
*G01R 31/04* (2006.01)

(52) U.S. Cl.
CPC .......... *G01R 31/2853* (2013.01); *G01R 1/0408* (2013.01); *G01R 31/048* (2013.01)

(58) Field of Classification Search
CPC ........... G01R 31/2853; G01R 31/0408; G01R 1/0408
See application file for complete search history.

(56) References Cited

U.S. PATENT DOCUMENTS

| | | | | |
|---|---|---|---|---|
| 6,052,287 A | * | 4/2000 | Palmer | H01L 23/49827 174/255 |
| 6,564,986 B1 | | 5/2003 | Hsieh | |
| 6,597,189 B1 | * | 7/2003 | Grilletto | 324/750.14 |
| 6,924,637 B2 | | 8/2005 | Casey et al. | |
| 6,954,082 B2 | * | 10/2005 | Grillettc | 324/750.02 |
| 7,528,616 B2 | * | 5/2009 | Grilletto et al. | 324/754.18 |
| 7,906,734 B2 | | 3/2011 | Del Rosario et al. | |
| 2004/0016995 A1 | * | 1/2004 | Kuo | B81C 1/0023 257/678 |
| 2006/0194353 A1 | * | 8/2006 | Spuhler | G01R 31/048 438/14 |
| 2007/0023910 A1 | * | 2/2007 | Beddingfield | H01L 23/49816 257/738 |
| 2007/0096760 A1 | * | 5/2007 | Cheng | G01R 1/0483 324/756.05 |
| 2011/0317381 A1 | * | 12/2011 | Kim | H01L 25/0657 361/761 |
| 2015/0008575 A1 | * | 1/2015 | Liu | H01L 24/81 257/737 |

OTHER PUBLICATIONS

Uppalapati, Ramgopal, et al., "Voltage In-situ Electrical Metrology for Test-to-Failure BGA Component Shock Margin Assessment", IEEE 2012, pp. 981-989.

* cited by examiner

*Primary Examiner* — Jermele M Hollington

(57) ABSTRACT

An apparatus for determining an electrical reliability of a ball grid array (BGA) assembly of an integrated circuit is presented. The assembly comprises a testing printed circuit board (PCB) having an integrated circuit (IC) test region located thereon. Vias extend through the testing PCB from a surface to an underside thereof within the IC test region. Each via has an IO pad or ground pad electrically connectable thereto. An IC package having an IC die connected thereto by solder bumps is connected to the IC test region by solder balls, such that each of the IO pads is electrically connectable to a respective pair of the solder balls and solder bumps by the vias. A method of testing interconnection reliability of the BGA using the apparatus is also presented.

11 Claims, 3 Drawing Sheets

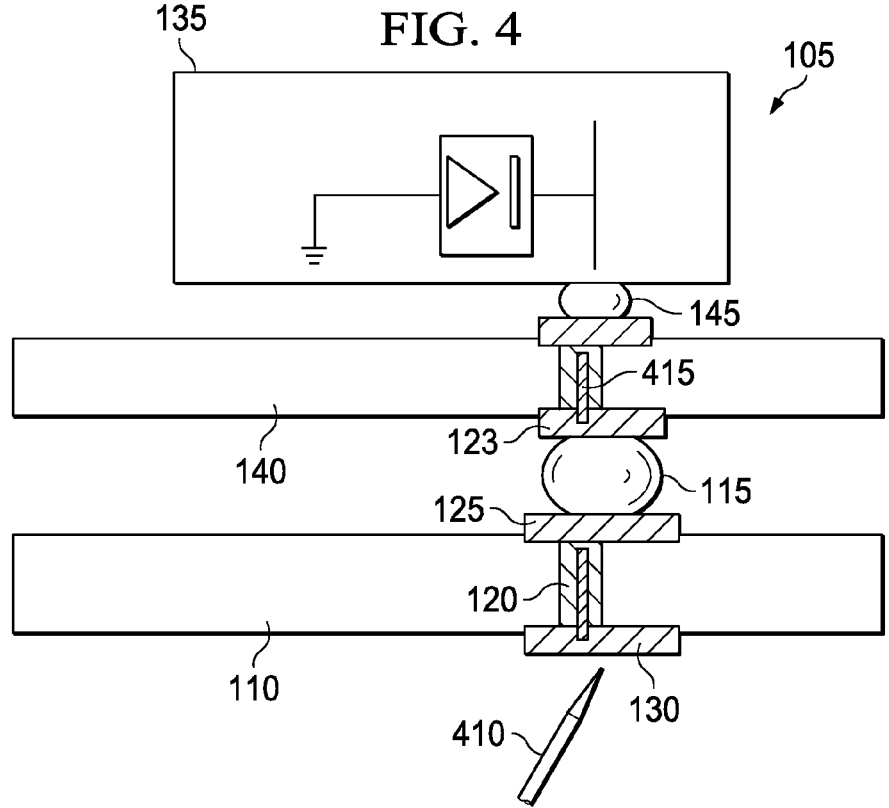
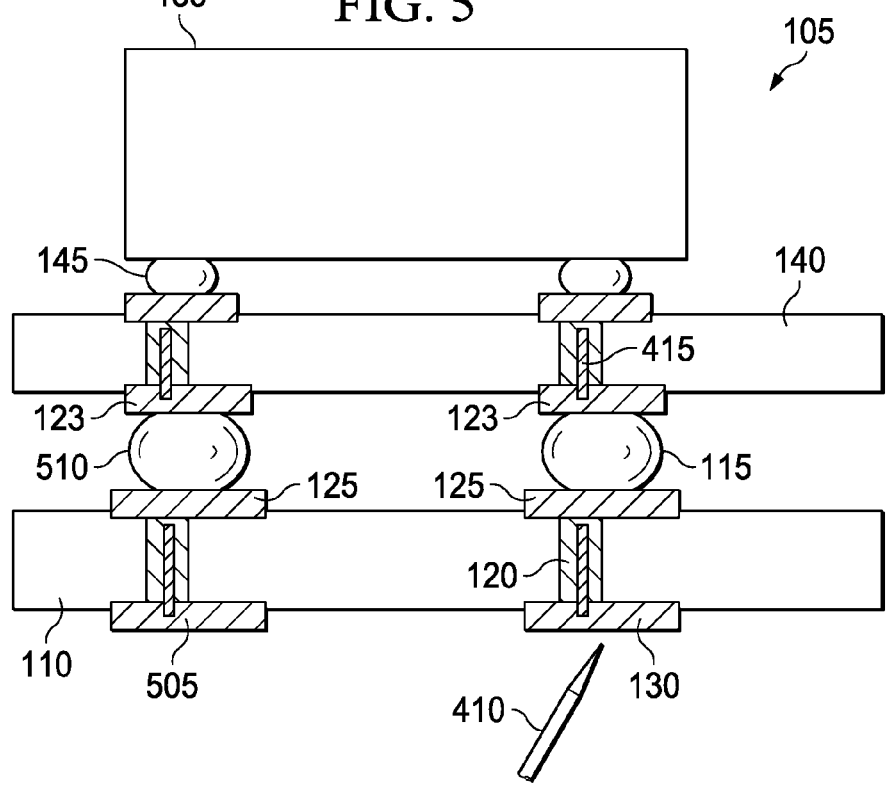

METHOD AND APPARATUS FOR TESTING INTERCONNECTION RELIABILITY OF A BALL GRID ARRAY ON A TESTING PRINTED CIRCUIT BOARD

TECHNICAL FIELD

This application is directed, in general, to a method and apparatus for testing interconnection reliability of a ball grid array (BGA) on a testing printed circuit board (PCB).

BACKGROUND

Integrated circuit (IC) devices typically included an IC chip housed in an IC "package" that typically includes a plastic, ceramic, or metal substrate. The IC chip includes an IC formed on a thin wafer of silicon. The IC package supports and protects the IC chip and provides electrical connections between the IC and an external circuit or system. Typically, the IC package is connected to a PCB by way of solder balls that form a BGA.

To ensure consistent quality, IC manufacturers typically test their IC devices thoroughly before shipping to customers. Part of this IC testing determines if the IC device is functional, and the results of these tests provide customers operating characteristics that are used by the customers in designing their systems. Another portion of the testing process involves determining the reliability of the IC package when subjected to various environmental conditions, such as extreme temperatures and mechanical stress. Typically, these system level reliability tests are conducted only by building a complete circuit board with all peripheral components and circuits, which is similar to a graphic card or motherboard. In such cases, reliability tests are often limited to the power cycling and some kind of thermal cycling and vibration and the testing of connection BGA is very limited. To address this issue, the testing of the reliability of bumps or solder joints of a BGA package is typically conducted on a separate daisy chain PCB that has to be specifically designed and built, which adds cost and time to the overall fabrication process.

SUMMARY

One aspect of this disclosure provides a method of determining a reliability of a ball grid array (BGA) assembly of an integrated circuit. This embodiment comprises electrically connecting an IC package, having an IC die connected thereto by solder bumps, to an IC test region of a testing PCB by forming solder balls between bond pads of the IC package substrate and the testing PCB. The testing PCB has IO and ground pads located on an underside thereof and within the IC test region. Each of the IO and ground pads is electrically connectable, respectively, to different pairs of the solder bumps and solder balls. The IC package is stressed and an electrical reliability of either or both of a solder bump and solder ball of at least one of the pair of solder bumps and solder balls is determined. The reliability is determined subsequent to the stressing, by applying a voltage across the IO and ground pads that are electrically connectable to respective pairs said solder bumps and solder balls.

In another embodiment, a different method of determining an electrical reliability of a ball grid array (BGA) assembly of an integrated circuit is presented. In this embodiment, the method comprises stressing the IC package that is connected to a testing PCB by solder balls. The IC package has an IC die that is connected to it by solder bumps. The testing PCB has IO and ground pads located on an underside thereof and within an IC test region. Each of the ground and IO pads is respectively, connected to a different pair of the solder balls and solder bumps by vias. After the IC testing device is stressed, the electrical continuity of the solder balls and solder bumps is tested by applying electrical current through IO to ground pads, or ground to ground pads that are connected to different pairs of the solder balls and solder bumps.

In another embodiment, an apparatus for determining the reliability of a ball grid array (BGA) assembly of an integrated circuit is presented. In this embodiment, the assembly comprises a testing printed circuit board (PCB) having an integrated circuit (IC) test region located thereon. Vias extend through the testing PCB from a surface to an underside thereof within the IC test region. Each via has an IO pad or ground pad connected thereto. An IC package having an IC die connected thereto by solder bumps is connected to the IC test region by solder balls, such that each of the IO pads is connected to a respective pair of the solder balls and solder bumps by the vias.

BRIEF DESCRIPTION

Reference is now made to the following descriptions taken in conjunction with the accompanying drawings, in which:

FIG. 4 illustrates a partial view of the IC test apparatus configured to test a signal pin of an IC die; and FIG. 5 illustrates a partial view of the IC test apparatus configured to test a solder ball joint of an IC package.

DETAILED DESCRIPTION

The present disclosure is directed to a method and system for testing the reliability of solder joints in an IC package assembly that includes an IC device and that is connected to a testing PCB by a BGA. The present disclosure offers advantages over conventional methods and apparatus in that the testing PCB does not have to be re-designed, as is the case with daisy chained boards. Moreover, the testing PCB can be standardized to test different types of IC packages and IC devices and multiple IC packages at the same time. Additionally, it does not involve the costly and time-consuming steps of producing a completed circuit board with all the peripheral components and circuits associated with it, such as a graphics card or motherboard. Thus, the product development cycle and the system/board level qualification can be significantly reduced by several months, and the cost of the board level qualification can be significantly reduced, as well. Another advantage provided by the present disclosure is that the reliability failure risk of the component/package can be reduced because the PCB board level qualification test of the IC package is done in a time duration long enough so that most of the possible failure modes in the field are detected.

Figure 1:
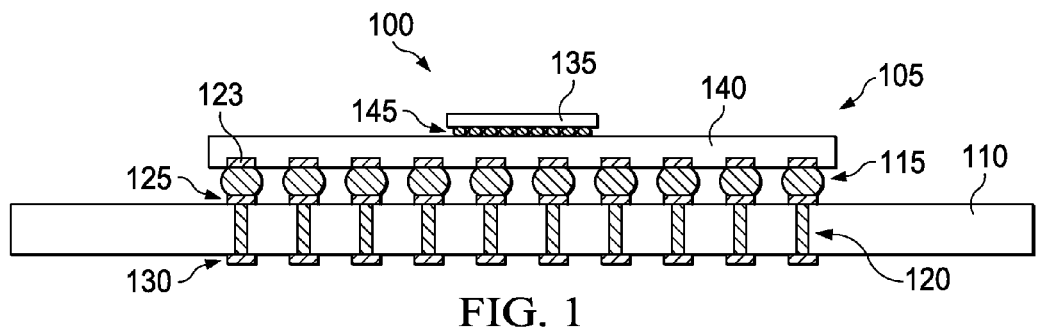
FIG. 1 illustrates an embodiment of an IC test apparatus.

FIG. 1 illustrates one embodiment of an IC testing system 100. This particular embodiment includes an IC package 105 attached to a testing PCB 110 by an array of solder balls 115. The solder balls 115 may be comprised of conventional materials, such as silver, tin, copper, or a combination of these or other known soldering or conductive materials. The PCB 110 includes vias 120 that extend from the upper surface of the PCB 110 to its underside, as shown. The testing PCB 110 requires very little re-design to function as a test board, unlike conventional daisy change boards, and it does not require a daisy chained component which requires a special wiring on the component substrate to be matched with the board layout.

Each of the vias 120 connect with bond pads 123 located on an underside of the IC package 105, bond pads 125 located on the upper surface of the testing PCB 110, and IO/ground pads 130 are located on the underside surface of PCB 110. The bond pads 125, in turn, are each connected to a different solder ball 115, as shown in the embodiment of FIG. 1. In one embodiment, the IO/ground pads 130 are laid out in a grid pattern. Thus, each underside pad 130 of the PCB is either an IO pad or a corresponding ground pad, which allows for individual pin testing in the IC package 105, without the need of designing a daisy chain PCB or full functional board, as found in conventional devices and methods.

An IC die 135 is connected to an IC package substrate 140 by solder bumps 145, which may be comprised of solder or other conductive materials. The IC die 135 includes not only signal processors, but also memory devices, microprocessors, and other forms of ICs. Some of the solder bumps 145 are signal or Vdd pins, while the remaining pins are ground pins. Typically, each of the solder bumps 145 is connected to a different solder ball 115 by an interconnect structure within the IC die 135 (not shown) that contacts the IC die bond pads 123. Each of the bond pads 123 contacts a different solder ball 115, which in turn, contacts an IO/ground pad 130 through the vias 120, as discussed above. As such, all of the IO/ground pads 130 are active in that each IO/ground pad 130 is connected by a via 120 to a solder ball 115, which in turn is connected to a solder bump 145. This pairing configuration allows for individual testing of each pair of solder balls 115 and solder bumps 145 or simultaneous testing of multiple pairs without the need of extraneous pads connected to a reference potential, as provided by certain conventional devices. In other embodiments, as explained below, just the solder balls 115, may be tested for reliability, and by a process of elimination, the reliability of certain solder bumps 145 may also be determined.

Figure 2:
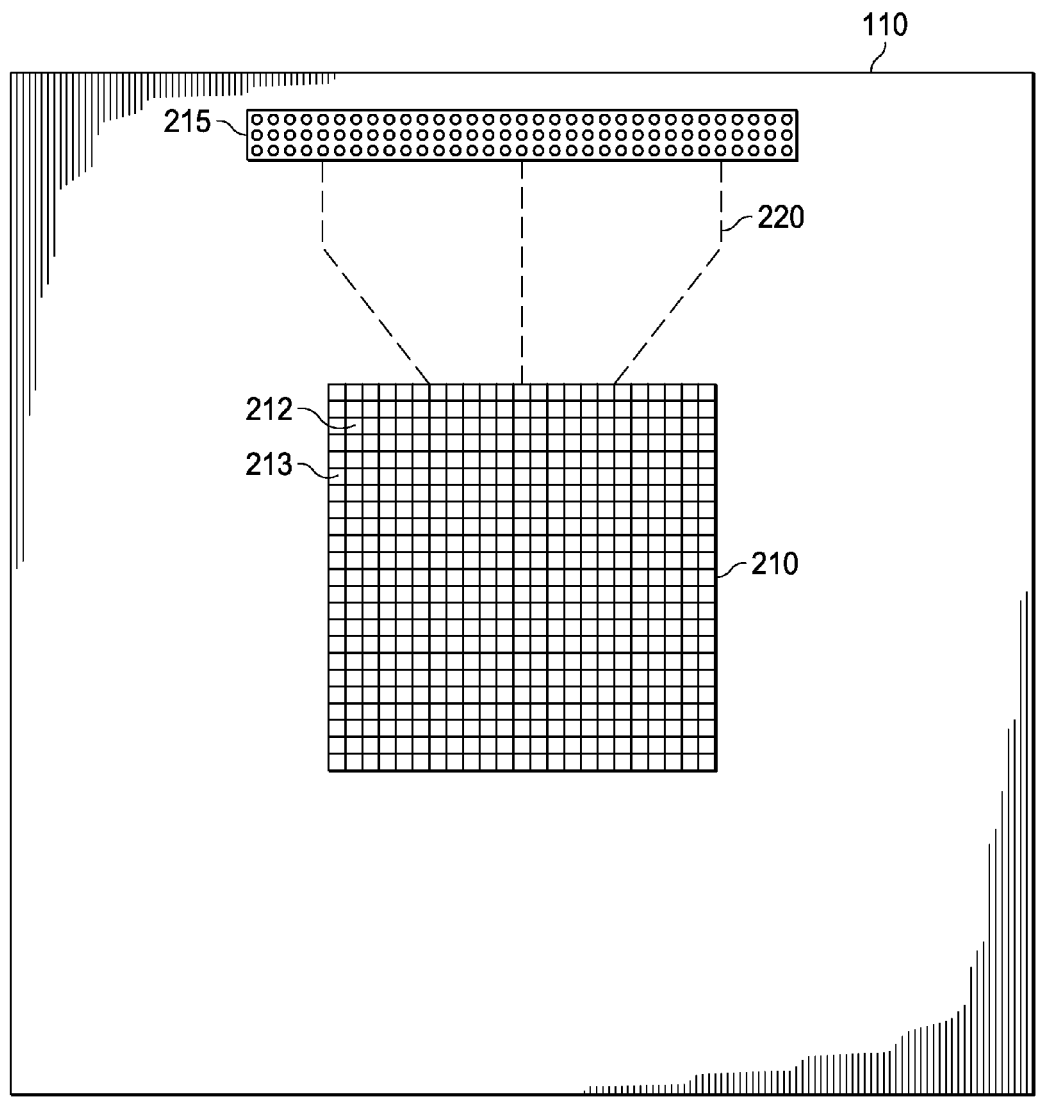
FIG. 2 illustrates an embodiment of a testing PCB.

FIG. 2 illustrates one embodiment of the testing PCB 110 of FIG. 1. The testing PCB 110 includes an IC die region 210 that has a perimeter footprint, or geometric shape, that matches the perimeter footprint of the IC package 105. The IC die region 210 is divided into voltage drain-to-drain (Vdd) and ground regions 212, 213 that correspond to respective IO/ground pads 130 underneath the testing PCB 110, as explained above. This embodiment further includes a pin connector 215 that may have about 100 or more pins. The number of pins, however, in the pin connector 215 may vary and will depend on the types of IC dies being tested, and as such, in other embodiments, it may have less pins than the above-stated number. The testing PCB 110 may be manufactured from conventional materials and will comprise one or more metal layers that include metal lines or runners 220 that correspondingly connect certain areas of the IC die region 210 with different pins of the pin connector 215. Though only three runners 220 are representatively shown, it should be understood that the number of metal runners 220 will depend on the number of pins in the pin connector 215 and the number of contact points of the IC die region 210 that need to be connected. The contact points can be determined from a test history of the particular IC die 135 under test. For example, if a certain IC die 135 has areas of particular, functional interest, the IC die region 210 may be hard-wired so that those areas are individually connected to the pin connector 215. As such, those areas can be tested easily and quickly by using the pin connector 215 using conventional automated testing equipment (ATE). The ATE may be re-arranged to a standard layout to match a standard socket or loadboard. In such cases, a universal socket and test setup may be used; either scenario, however, eliminates or minimizes the tooling time and cost.

The testing PCB 110 structure, including the board thickness and layer counts may be the same as a real product board except the routing, which is significantly minimized in the testing PCB 110. This ensures that the solder ball stress conditions are kept the same as those that the components would experience in the field for a full production board. Alternatively, the testing PCB 110 may use a standard structure, which is to compare the reliability performance with other similar BGA packages. This saves cost in the design and build-out of the testing PCB 110.

Figure 3:
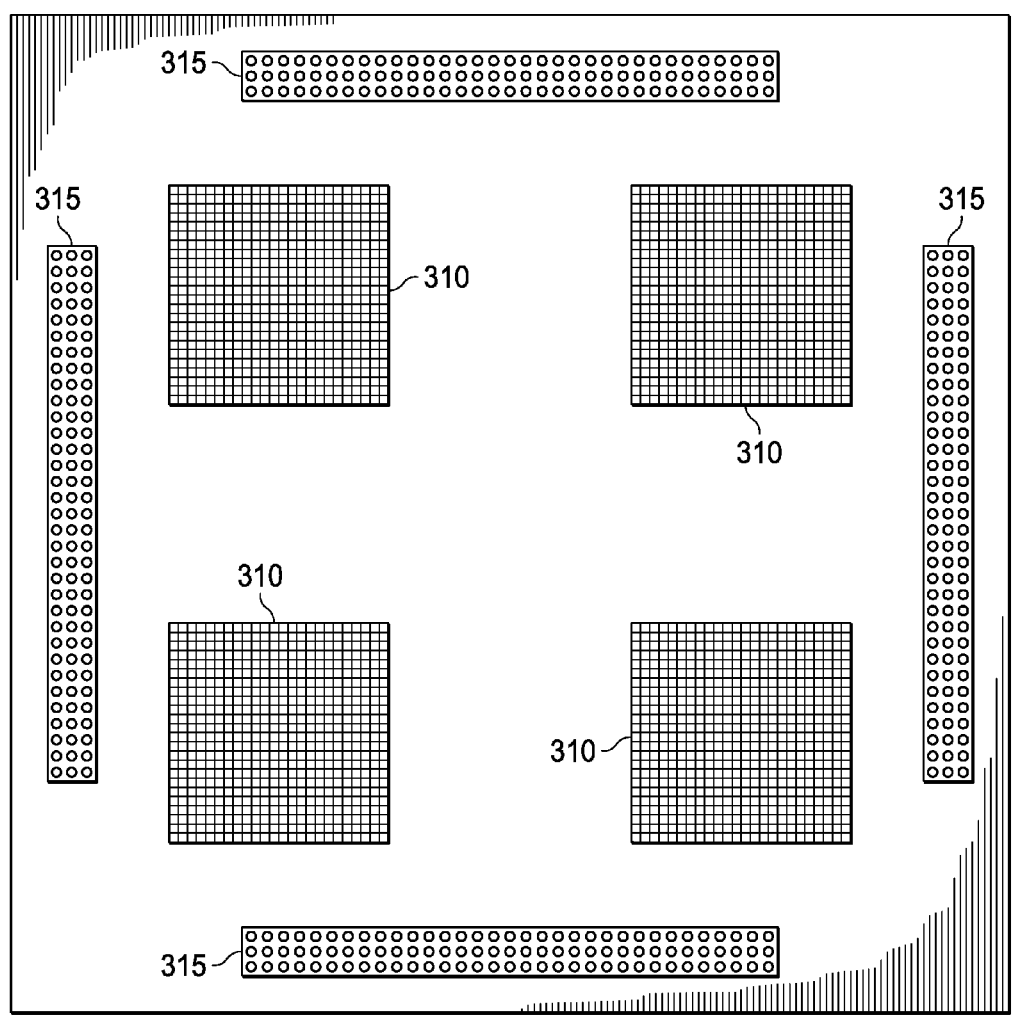
FIG. 3 illustrates another embodiment of the PCB.

FIG. 3 illustrates another embodiment of the testing PCB 110 of FIG. 1. In this embodiment, the testing PCB 110 includes multiple IC die regions 310 that are connected, respectively, to adjacent pin connectors 315. The multiple IC die regions 310 may be configured the same as the IC die region 210 of FIG. 2. Though not shown, areas of particular functional interest of the IC die regions 310 can be hard-wired to the pin connectors 315 in the same manner, as discussed above regarding FIG. 2.

FIG. 4 is a close-up view of a portion of the IC testing system 100 of FIG. 1. During and after the stress test, the embodiments discussed herein enable every solder ball, as well as specifically selected solder balls, to be tested, and with proper design, every solder bump 145 at the IC die 135 may also be tested. The stress imparted to the IC testing systems 100 may include both thermal and mechanical stresses. For the thermal stress, it may come from thermal cycling or power cycling. For example, the IC testing system 100 of FIG. 1, can be put into a thermal chamber using a standard temperature profile. In such cases, the stress analysis would be more focused on the reliability and failure of the board level solder balls 115. However, the IC testing system 100 can also be used for a direct power cycling by applying a voltage to the power Vdd pins. In this case, the stress is more concentrated on the IC die 135 level solder bumps 145, so that the solder bump reliability will be tested effectively. Alternatively, the IC testing system 100 may be used for mechanical stress tests such as bending, mechanical shock, and vibration tests.

In one example, the stress may be done by repeatedly applying a voltage to the IC die 135 by using either the previously discussed pin connectors 215, 315, or probe 410 to connect to Vdd and to a corresponding ground pad, as discussed above. In those instances where the pin connectors 215, 315 are used, they will be hard-wired to the appropriate Vdd and ground pads 130, and in those instances where the probe 410 is used, it will be brought into contact with the Vdd and ground pads 130. A voltage is applied for a pre-determined amount of time, which generates a current through the IC die 135 and raises the temperature of the IC die 135 to at least its operating temperature. Afterward, the IC die 135 is allowed to cool down. This type of thermal cycling is repeated until a failure occurs in the device or reliability testing requirements are otherwise met. When the device fails, one or more solder balls 115 and solder bumps 145 pairs are tested to determine where the failure occurred. As seen in the illustrated embodiment, the solder bump 145 is connected to the solder ball 115 by a via 415 that extends through the IC package substrate 140. In one methodology, the probe 410 is placed in contact with the IO pad and corresponding ground pads 130, which causes current to be applied across the IC die 135. If the voltage reading is large, indicating an increased resistance, a failure occurred in either the solder ball 115 or solder bump 145 as the result of the thermal stress. This pin-to-pin process can be repeated for all the signal pins for the IC die 135 or for a portion of them, which may be monitored using a data logger or a curve tracer or similar instruments. Alternatively, the pin connectors 215, 315, as discussed above, can be used to determine if failures occurred in certain hard-wired regions of the IC die 135.

With reference to FIG. 5, the IC package 105 may be tested using in-situ monitoring or offline tests. In the case of in-situ monitoring, a ground pad 505 is taken as a reference ground. The solder balls 510 in the areas of interest, such as corner solder joints, which are ground connected, are selected and closed circuit loops are formed by measuring the resistance between solder balls 115 and 510, and the reference ground 505. A high resistance value is an indication that failure occurred at solder ball 115. However, if the resistance value is within normal parameters, the corresponding solder bump 145 that is connected to the test solder ball 115 can be individually tested by placing a current across the IC die 135, in a manner described above. If the voltage reading is outside design parameters, then it can be concluded that the solder bump 145 is faulty, if the previous reference ground test of the solder ball 115 showed to be within design parameters. In this manner the fault can be ascribed to a particular solder bump 145.

With reference to FIGS. 1-5, in one embodiment, the disclosure is directed to a method of determining an electrical reliability of the ball grid array (BGA) assembly of the IC package 105. This embodiment comprises electrically connecting an IC package 105, having an IC die 135 connected thereto by solder bumps 145, to an IC test region 210 of a testing PCB 110 by forming solder balls 115 between bond pads 123 of the IC package 105 and the testing PCB 110. Conventional re-flow soldering processes may be used to connect the IC package 105 to the testing PCB 110. The testing PCB 110 has IO and ground pads 130, 505, located on an underside thereof and within the IC test region 210, wherein each of the IO and ground pads 130, 505 is connected, respectively, to different pairs of the solder bumps and solder balls 145 and 115. The IC package 105 is then stressed in a manner discussed above. An electrical reliability of either or both of the solder bump 145 and solder ball 115 is conducted subsequent to the stressing by connecting to IO pad and ground pad 130, 505, in a manner as previously described. The connection may be made by either using individual probes 410 to contact the probe and ground pads 130, 505, or by using the pin-connector 215, 315 that is hard-wired to the IO and ground pads 130, 505.

In another embodiment, a different method of determining an electrical reliability of a ball grid array (BGA) assembly of an integrated circuit is presented. In this embodiment, the method comprises stressing the IC package 105 that is connected to a testing PCB 110 by solder balls 115. The IC package 105 has an IC die 135 connected thereto by solder bumps 145. The testing PCB 110 has IO and ground pads 130, 505 located on an underside thereof and within an IC test region 210. Each of the ground and IO pads 130, 505 is respectively, connected to a different pair of the solder balls 115 and solder bumps 145. After the IC testing device 100 is stressed, as previously discussed, the electrical continuity of the solder balls 115 and solder bumps 145 is tested by applying a current across the IO and ground pads 130, 505 that are connected to different pairs of the solder balls 115 and solder bumps 145.

Those skilled in the art to which this application relates will appreciate that other and further additions, deletions, substitutions and modifications may be made to the described embodiments.

What is claimed is:

1. A method of determining an electrical reliability of a ball grid array (BGA) assembly of an integrated circuit, comprising:

stressing an integrated circuit (IC) package electrically connectable to a testing printed circuit board (PCB) by solder balls, said IC package having an IC die electrically connectable thereto by solder bumps, said testing PCB having IO and ground pads located on an underside thereof and within an IC test region, wherein each of said ground and IO pads is respectively, electrically connectable to a different pair of said solder balls and solder bumps to allow for individual pin testing in said IC package; and testing an electrical continuity of said solder balls and solder bumps of said IC package after said IC package is stressed by applying a current through said IO to ground pads or through ground to ground pads connected to said different pairs of said solder balls and solder bumps, wherein said ground pads are reference ground pads, and said testing includes measuring a resistance of an electrical path between a solder ball connected to one of said reference ground pads and a solder bump of said at least one of said pair of solder balls and solder bumps, or wherein testing includes measuring a resistance of an electrical path between said IC die and said at least one of said pair of solder balls or solder bumps.

2. The method of claim 1, wherein said stressing includes thermal cycling said IC package or subjecting said IC package to a physical stress.

3. The method of claim 2, wherein thermal cycling includes generating a current through said IC die by contacting one of said IO pads and one of said ground pads, respectively, connected to respective pairs of solder balls and solder bumps.

4. The method of claim 1, wherein said testing PCB includes a plurality of said IC testing region and said method further includes testing a plurality of pairs of solder balls and solder bumps associated with each of said IC packages.

5. The method of claim 1, wherein said testing PCB includes an electrical pin connector mounted to a surface of said testing PCB and electrically connectable to pre-determined regions of said IC die region, and testing includes determining a reliability of at least one of said pair of said solder balls and solder bumps that is electrically connectable to said electrical pin connector.

6. The method of claim 1, further comprising determining a reliability of either or both of a solder bump and solder ball of at least one of said pair of solder bumps and solder balls, subsequent to said stressing, by contacting said IO and ground pads electrically connectable to respective pairs of said solder bumps and solder balls.

7. The method of claim 6, wherein said determining includes measuring a resistance of an electrical path between said IC die and said at least one of said pair of solder bumps and solder balls.

8. The method of claim 1, wherein said testing PCB includes a plurality of said IC testing regions and said method further includes electrically connecting one of said IC packages to each of said plurality of said IC testing regions and determining an electrical reliability of each of said IC packages.

9. The method of claim 1, wherein stressing includes repeatedly generating a current through said IC die for a pre-determined amount of time to ramp a temperature of said IC die up to at least an operating temperature of said IC die, maintaining said temperature for a pre-determined amount of time, and allowing said IC die to cool.

10. The method of claim 1, wherein said testing PCB includes a plurality of said IC die regions, each having an electrical pin connector electrically connectable thereto.

11. The method of claim 10, wherein said plurality of said IC die regions is configured to receive a different IC package thereon.

* * * * *